United States Patent
Wang

(10) Patent No.: US 10,210,840 B2
(45) Date of Patent: Feb. 19, 2019

(54) SHIFT REGISTER UNIT, ITS DRIVING METHOD, GATE DRIVER CIRCUIT AND DISPLAY DEVICE

(71) Applicants: BOE TECHNOLOGY GROUP CO., LTD., Beijing (CN); ORDOS YUANSHENG OPTOELECTRONICS CO., LTD., Ordos (CN)

(72) Inventor: Bo Wang, Beijing (CN)

(73) Assignees: BOE TECHNOLOGY GROUP CO., LTD., Beijing (CN); ORDOS YUANSHENG OPTOELECTRONICS CO., LTD., Ordos (CN)

(*) Notice: Subject to any disclaimer, the term of this patent is extended or adjusted under 35 U.S.C. 154(b) by 46 days.

(21) Appl. No.: 15/209,250

(22) Filed: Jul. 13, 2016

(65) Prior Publication Data

US 2017/0193961 A1     Jul. 6, 2017

(30) Foreign Application Priority Data

Jan. 4, 2016 (CN) .......................... 2016 1 0003857

(51) Int. Cl.
*G09G 5/00* (2006.01)
*G11C 19/28* (2006.01)

(52) U.S. Cl.
CPC ............. *G09G 5/003* (2013.01); *G11C 19/28* (2013.01); *G09G 2300/0426* (2013.01);
(Continued)

(58) Field of Classification Search
CPC ... G09G 2310/0286; G09G 2300/0426; G09G 2310/08; G09G 2330/021; G09G 5/003; G11C 19/28; G11C 7/1018; G11C 7/1036; G11C 8/04; G11C 19/00; G11C 19/0875; G11C 19/186; G11C 19/188; G11C 19/287; G11C 19/38; G11C 27/04; G11C 29/20; G11C 29/86; G06F 3/007; G06F 5/08; G06F 7/584; G06F 9/30134; G06F 9/30138; G06F 9/30141; G06F 7/30134;
(Continued)

(56) References Cited

U.S. PATENT DOCUMENTS 8,218,713 B2 * 7/2012 Hsu .................... G11C 19/28
                                                         377/64
8,547,319 B2 * 10/2013 Hwang ................ G09G 3/3677
                                                       345/100

(Continued)

*Primary Examiner* — Vinh T Lam
(74) *Attorney, Agent, or Firm* — Harness, Dickey & Pierce, P.L.C.

(57) ABSTRACT

The present disclosure provides a shift register unit, its driving method, a gate driver circuit and a display device. The shift register unit includes a control module, a first output module and a second output module. The first output module is connected to a first signal end, a first node and an output end. The second output module is connected to the output end, a second node and a first clock signal end. The control module is connected to the first node, the second node, the first signal end, a second signal end, a second clock signal end, a third clock signal end, an input signal end and a resetting signal end, and configured to control potentials at the first node and the second node.

20 Claims, 5 Drawing Sheets

(52) U.S. Cl.
CPC . *G09G 2310/0286* (2013.01); *G09G 2310/08* (2013.01); *G09G 2330/021* (2013.01)

(58) Field of Classification Search
CPC .. H04N 3/1575; H04N 5/372; H04N 5/37206; H04N 5/95; H04N 9/893; H04L 9/06; Y10S 505/83
See application file for complete search history.

(56) References Cited

U.S. PATENT DOCUMENTS

| | | | | |
|---|---|---|---|---|
| 9,113,534 | B2* | 8/2015 | Kim | G11C 19/184 |
| 9,230,482 | B2* | 1/2016 | Lee | G11C 19/184 |
| 9,368,230 | B2* | 6/2016 | Yao | G11C 19/184 |
| 9,437,141 | B2* | 9/2016 | Lee | G09G 3/3291 |
| 9,613,582 | B2* | 4/2017 | Kim | G09G 3/3677 |
| 9,818,339 | B2* | 11/2017 | Li | G09G 3/3225 |
| 2007/0217563 | A1* | 9/2007 | Chang | G11C 19/28 377/64 |
| 2011/0058642 | A1* | 3/2011 | Tsai | G09G 3/3677 377/79 |
| 2012/0269315 | A1* | 10/2012 | Jang | G11C 19/28 377/75 |
| 2016/0019976 | A1* | 1/2016 | Pai | G09G 3/3266 345/204 |
| 2016/0210925 | A1* | 7/2016 | Chung | G09G 3/3677 |
| 2016/0320681 | A1* | 11/2016 | Kim | G02F 1/136204 |
| 2017/0309211 | A1* | 10/2017 | Zhang | G09G 3/20 |

\* cited by examiner

SHIFT REGISTER UNIT, ITS DRIVING METHOD, GATE DRIVER CIRCUIT AND DISPLAY DEVICE

CROSS-REFERENCE TO RELATED APPLICATION

The present application claims a priority of the Chinese Patent Application No. 201610003857.8 filed on Jan. 4, 2016, which is incorporated herein by reference in its entirety.

TECHNICAL FIELD

The present disclosure relates to the field of display technology, in particular to a shift register unit, its driving method, a gate driver circuit and a display device.

BACKGROUND

In the case of displaying an image, a display device needs to scan pixel units through a shift register. The shift register includes a plurality of shift register units, each of which corresponds to the pixel units in one row. The pixel units are scanned and driven progressively by the shift register units, so as to enable the display device to display the image.

Along with the increase of the number of pixels, the rows of the pixels desired to be scanned by the shift register (a gate switch circuit) within one frame will increase too. At this time, it needs to reduce a layout area of each shift register unit and simplify a circuit structure. Usually, a potential of a signal from a circuit is controlled by the conventional shift register unit through a plurality of transistors and capacitors.

However, the circuit structure of each shift register unit and the control procedure thereof are relatively complex, so it is difficult to provide the signal with a stable waveform.

SUMMARY

An object of the present disclosure is to provide a shift register unit, its driving method, a gate driver circuit and a display device, so as to simplify a circuit structure of the shift register unit.

In one aspect, the present disclosure provides in some embodiments a shift register unit, including a control module, a first output module and a second output module. The first output module is connected to a first signal end, a first node and an output end, and configured to input a first control signal from the first signal end to the output end under the control of the first node. The second output module is connected to the output end, a second node and a first clock signal end, and configured to input a first clock signal from the first clock signal end to the output end under the control of the second node. The control module is connected to the first node, the second node, the first signal end, a second signal end, a second clock signal end, a third clock signal end, an input signal end and a resetting signal end, and configured to control potentials at the first node and the second node under the control of the first control signal from the first signal end, a second control signal from the second signal end, a second clock signal from the second clock signal end, a third clock signal from the third clock signal end, an input control signal from the input signal end and a resetting signal from the resetting signal end.

Alternatively, the control module includes a first control sub-module, a second control sub-module, a resetting sub-module, a pull-up sub-module and a bleeder sub-module. The first control sub-module is connected to the input signal end, the second clock signal end, the second signal end and a third node, and configured to input the second control signal from the second signal end to the third node under the control of the input control signal from the input signal end and the second clock signal from the second clock signal end. The second control sub-module is connected to the third clock signal end, the first signal end, the second signal end, the first node and the third node, and configured to input the second control signal from the second signal end to the first node and input the first control signal from the first signal end to the third node under the control of the third clock signal from the third clock signal end. The resetting sub-module is connected to the resetting signal end, the first signal end and the third node, and configured to input the first control signal from the first signal end to the third node under the control of the resetting signal from the resetting signal end. The pull-up sub-module is connected to the third node, the first signal end, the input signal end and the first node, and configured to input the first control signal from the first signal end to the first node under the control of the input control signal from the input signal end and the third node. The bleeder sub-module is connected to the second signal end, the third node and the second node, and configured to input a potential at the third node to the second node under the control of the second control signal from the second signal end.

Alternatively, the first control sub-module includes a first transistor and a second transistor. A first electrode of the first transistor is connected to the second signal end, a second electrode thereof is connected to a first electrode of the second transistor, and a third electrode thereof is connected to the input signal end. The first electrode of the second transistor is connected to the second electrode of the first transistor, a second electrode thereof is connected to the third node, and a third electrode thereof is connected to the second clock signal end.

Alternatively, the second control sub-module includes a third transistor and a fourth transistor. A first electrode of the third transistor is connected to the second signal end, a second electrode thereof is connected to the first node and a third electrode of the fourth transistor, and a third electrode thereof is connected to the third clock signal end. A first electrode of the fourth transistor is connected to the first signal end, a second electrode thereof is connected to the third node, and the third electrode thereof is connected to the second electrode of the third transistor.

Alternatively, the resetting sub-module includes a fifth transistor, a first electrode of which is connected to the first signal end, a second electrode of which is connected to the third node, and a third electrode of which is connected to the resetting signal end.

Alternatively, the pull-up sub-module includes a sixth transistor and a seventh transistor. A first electrode of the sixth transistor is connected to the first signal end, a second electrode thereof is connected to the first node, and a third electrode thereof is connected to the input signal end. A first electrode of the seventh transistor is connected to the first signal end, a second electrode thereof is connected to the first node, and a third electrode thereof is connected to the third node.

Alternatively, the bleeder sub-module includes an eighth transistor, a first electrode of which is connected to the third node, a second electrode of which is connected to the second node, and a third electrode of which is connected to the second signal end.

Alternatively, the first output module includes a ninth transistor and a first capacitor. A first electrode of the ninth transistor is connected to the first signal end, a second electrode thereof is connected to the output end, and a third electrode thereof is connected to the first node. A first electrode of the first capacitor is connected to the first electrode of the ninth transistor, and a second electrode thereof is connected to the third electrode of the ninth transistor.

Alternatively, the second output module includes a tenth transistor and a second capacitor. A first electrode of the tenth transistor is connected to the first clock signal end, a second electrode thereof is connected to the output end, and a third electrode thereof is connected to the second node. A first electrode of the second capacitor is connected to the second electrode of the tenth transistor and a second electrode thereof is connected to the third electrode of the tenth transistor.

Alternatively, the transistors are P-type transistors.

In another aspect, the present disclosure provides in some embodiments a method for driving the above-mentioned shift register unit which includes a first output module, a second output module and a control module, including steps of: at a first stage, inputting, by a resetting signal end, a resetting signal at a second potential, and inputting, by the control module, a first control signal at a first potential from a first signal end to a second node; at a second stage, inputting, by a first clock signal end, a first clock signal at the first potential, inputting, by an input signal end, an input control signal at the second potential, inputting, by a second clock signal end, a second clock signal at the second potential, inputting, by the control module, the first control signal to a first node and inputting a second control signal at the second potential from a second signal end to the second node, and inputting, by the second output module, the first clock signal from the first clock signal end to an output end under the control of the second node; at a third stage, maintaining the second potential at the second node, inputting, by the first clock signal end, the first clock signal at the second potential, and inputting, by the second output module, the first clock signal to the output end under the control of the second node; and at a fourth stage, inputting, by a third clock signal end, a third clock signal at the second potential, inputting, by the control module, the second control signal from the second signal end to the first node under the control of the third clock signal from the third clock signal end, and inputting, by the first output module, the first control signal from the first signal end to the output end under the control of the first node.

Alternatively, the control module includes a first control sub-module, a second control sub-module, a resetting sub-module, a pull-up sub-module and a bleeder sub-module. The method further includes: at the second stage, inputting, by the second clock signal end, the second clock signal at the second potential, inputting, by the input signal end, the input control signal at the second potential, and inputting, by the first control sub-module, the second control signal from the second signal end to the third node; at the fourth stage, inputting, by the third clock signal end, the third clock signal at the second potential, inputting, by the second control sub-module, the second control signal from the second signal end to the first node and inputting the first control signal from the first signal end to the third node; at the first stage, inputting, by the resetting signal end, the resetting signal at the second potential, and inputting, by the resetting sub-module, the first control signal to the second node; at the second stage, inputting, by the input signal end, the input control signal at the second potential, maintaining the second potential at the third node, and inputting, by the pull-up sub-module, the first control signal from the first signal end to the first node; at the first to fourth stages, inputting, by the second signal end, the second control signal at the second potential, and inputting, by the bleeder sub-module, the potential at the third node to the second node.

Alternatively, the first control sub-module includes a first transistor and a second transistor. The method further includes, at the second stage, inputting, by the second clock signal end, the second clock signal at the second potential, inputting, by the input signal end, the input control signal at the second potential to turn on the first transistor and the second transistor, and inputting, by the second signal end, the second control signal to the third node.

Alternatively, the second control sub-module includes a third transistor and a fourth transistor. The method further includes, at the fourth stage, inputting, by the third clock signal end, the third clock signal at the second potential to turn on the third transistor, inputting, by the second signal end, the second control signal at the second potential to the first node and a third electrode of the fourth transistor so as to turn on the fourth transistor, and inputting, by the first signal end, the first control signal to the third node.

Alternatively, the resetting sub-module includes a fifth transistor. The method further includes, at the first stage, inputting, by the resetting signal end, the resetting signal at the second potential to turn on the fifth transistor, and inputting, by the first signal end, the first control signal to the third node.

Alternatively, the pull-up sub-module includes a sixth transistor and a seventh transistor. The method further includes, at the second stage, inputting, by the input signal end, the input control signal at the second potential, maintaining the second potential at the third node so as to turn on the sixth transistor and the seventh transistor, and inputting, by the first signal end, the first control signal to the first node.

Alternatively, the bleeder sub-module includes an eighth transistor. The method further includes, at the first to fourth stages, inputting, by the second signal end, the second control signal at the second potential so as to turn on the eighth transistor, and inputting, by the third node, the potential at the third node to the second node.

Alternatively, the first output module includes a ninth transistor and a first capacitor. The method further includes: at the fourth stage, inputting, by the control module, the second control signal at the second potential from the second signal end to the first node so as to turn on the ninth transistor, and inputting, by the ninth transistor, the first control signal from the first signal end to the output end; and at the second stage, inputting, by the control module, the first control signal at the first potential from the first signal end to the first node so as to turn off the ninth transistor.

Alternatively, the second output module includes a tenth transistor and a second capacitor. The method further includes: at the first stage, inputting, by the control module, the first control signal at the first potential to the second node so as to turn off the tenth transistor; at the second stage, inputting, by the control module, the second control signal at the second potential from the second signal end to the second node so as to turn on the tenth transistor, and inputting, by the tenth transistor, the first clock signal from the first clock signal end to the output end; and at the third stage, maintaining the second potential at the second node so as to turn on the tenth transistor, and inputting, by the tenth transistor, the first clock signal from the first clock signal end to the output end.

Alternatively, the transistors are P-type transistors.

Alternatively, the first potential is higher than the second potential.

In yet another aspect, the present disclosure provides in some embodiments a gate driver circuit including at least two of the above-mentioned shift register units connected to each other in a cascaded manner.

In still yet another aspect, the present disclosure provides in some embodiments a display device including the above-mentioned gate driver circuit.

According to the shift register unit, its driving method, the gate driver circuit and the display device in the embodiments of the present disclosure, the shift register unit includes the control module, the first output module and the second output module, so as to control the potentials at the output end. As a result, it is able to simplify a circuit structure of the shift register unit and a control procedure thereof, thereby to output a stable voltage by the output end.

BRIEF DESCRIPTION OF THE DRAWINGS

In order to illustrate the technical solutions of the present disclosure or the related art in a clearer manner, the drawings desired for the present disclosure or the related art will be described hereinafter briefly. Obviously, the following drawings merely relate to some embodiments of the present disclosure, and based on these drawings, a person skilled in the art may obtain the other drawings without any creative effort.

DETAILED DESCRIPTION OF THE EMBODIMENTS

Figure 1:
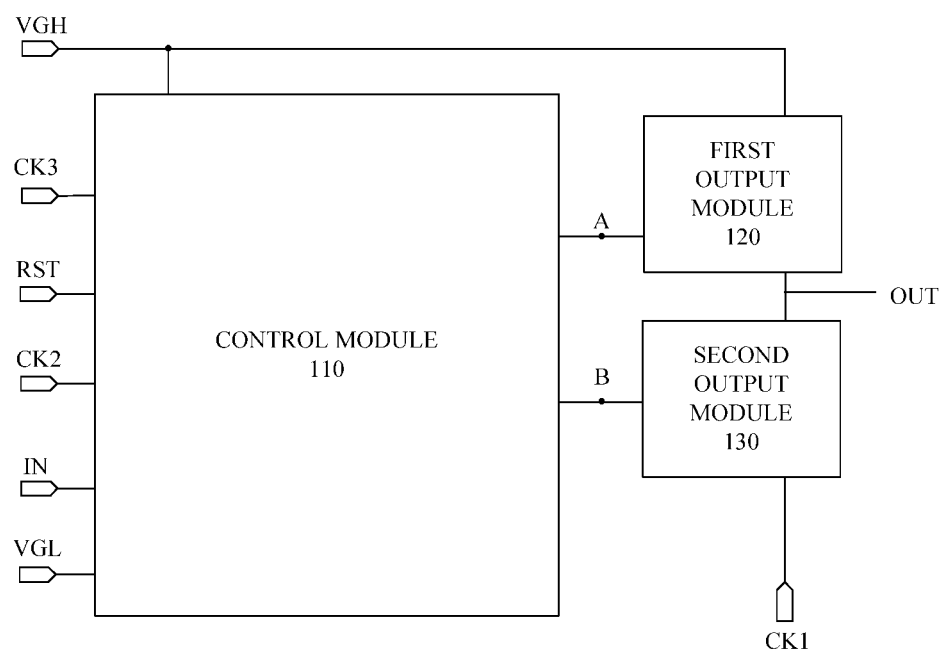
FIG. 1 is a schematic view showing a shift register unit according to one embodiment of the present disclosure.

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "connect" or "connected to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

Transistors adopted in the embodiments of the present disclosure may be thin film transistors (TFTs), field effect transistors (FETs) or any other devices having an identical characteristic. Depending on their effects in a circuit, the transistors adopted in the embodiments of the present disclosure are mainly switch transistors. A source electrode of each switch transistor is symmetrical to a drain electrode thereof, so they may be replaced with each other. In the embodiments of the present disclosure, the source electrode may be called as a first electrode, the drain electrode may be called as a second electrode, and a gate electrode may be called as a third electrode. In the drawings, an intermediate end of each transistor is the gate electrode, a signal input end is the source electrode and a signal output end is the drain electrode. In addition, the switch transistors include P-type switch transistors and N-type switch transistors. Each P-type switch transistor is turned on in the case of a low level at the gate electrode and turned off in the case of a high level at the gate electrode. Each N-type switch transistor is turned on in the case of a high level at the gate electrode and turned off in the case of a low level at the gate electrode. Further, each signal in the embodiments of the present disclosure may have a first potential and a second potential. However, the first potential and the second potential are merely used to indicate that the potential of the signal has two state variables, but not used to represent specific values. To be specific, the first control signal may be a high level signal, while the second control signal may be a low level signal.

The present disclosure provides in some embodiments a shift register unit which, as shown in FIG. 1, may include a control module 110, a first output module 120 and a second output module 130.

The first output module 120 is connected to a first signal end VGH, a first node A and an output end OUT, and configured to input a first control signal from the first signal end VGH to the output end OUT under the control of the first node A.

The second output module 130 is connected to the output end OUT, a second node B and a first clock signal end CK1, and configured to input a first clock signal from the first clock signal end CK1 to the output end OUT under the control of the second node B.

The control module 110 is connected to the first node A, the second node B, the first signal end VGH, a second signal end VGL, a second clock signal end CK2, a third clock signal end CK3, an input signal end IN and a resetting signal end RST, and configured to control potentials at the first node A and the second node B under the control of the first control signal from the first signal end VGH, a second control signal from the second signal end VGL, a second clock signal from the second clock signal end CK2, a third clock signal from the third clock signal end CK3, an input control signal from the input signal end IN and a resetting signal from the resetting signal end RST.

According to the shift register unit in the embodiments of the present disclosure, the shift register unit includes the control module, the first output module and the second output module, so as to control the potentials at the output end. As a result, it is able to simplify a circuit structure of the shift register unit and a control procedure thereof, thereby to output a stable voltage by the output end.

Figure 2:
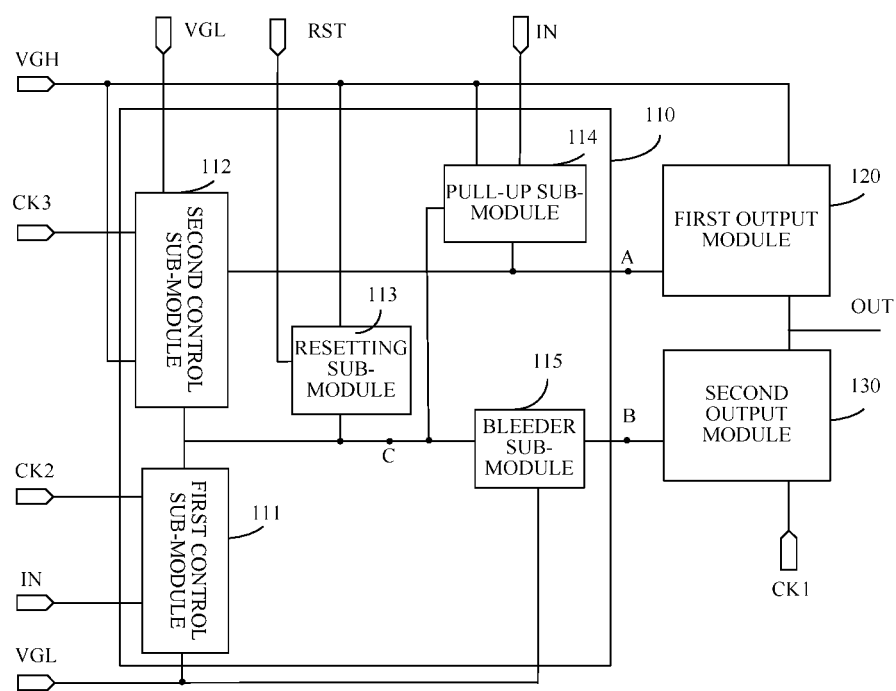
FIG. 2 is another schematic view showing the shift register unit according to one embodiment of the present disclosure.

As shown in FIG. 2, the shift register unit includes optional members as compared with that in FIG. 1, so as to achieve the performance in a better manner. The control module 110 includes a first control sub-module 111, a second control sub-module 112, a resetting sub-module 113, a pull-up sub-module 114 and a bleeder sub-module 115.

The first control sub-module 11 is connected to the input signal end IN, the second clock signal end CK2, the second signal end VGL and a third node C, and configured to input the second control signal from the second signal end VGL to the third node C under the control of the input control signal from the input signal end IN and the second clock signal from the second clock signal end CK2.

The second control sub-module 112 is connected to the third clock signal end CK3, the first signal end VGH, the second signal end VGL, the first node A and the third node C, and configured to input the second control signal from the second signal end VGL to the first node A and input the first control signal from the first signal end VGH to the third node C under the control of the third clock signal from the third clock signal end CK3.

The resetting sub-module 113 is connected to the resetting signal end RST, the first signal end VGH and the third node C, and configured to input the first control signal from the first signal end VGH to the third node C under the control of the resetting signal from the resetting signal end RST.

The pull-up sub-module 114 is connected to the third node C, the first signal end VGH, the input signal end IN and the first node A, and configured to input the first control signal from the first signal end VGH to the first node A under the control of the input control signal from the input signal end IN and the third node C.

The bleeder sub-module 115 is connected to the second signal end VGL, the third node C and the second node B, and configured to input a potential at the third node C to the second node B under the control of the second control signal from the second signal end VGL.

In the embodiments of the present disclosure, the control module may merely consist of transistors, i.e., the sub-modules (the first control sub-module 111, the second control sub-module 112, the resetting sub-module 113, the pull-up sub-module 114 and the bleeder sub-module 115) of the control module may merely consist of transistors. In addition, in an alternative embodiment, each sub-module may consist of not more than two transistors, so as to facilitate the manufacture thereof, reduce the production cost and improve the efficiency.

Figure 3:
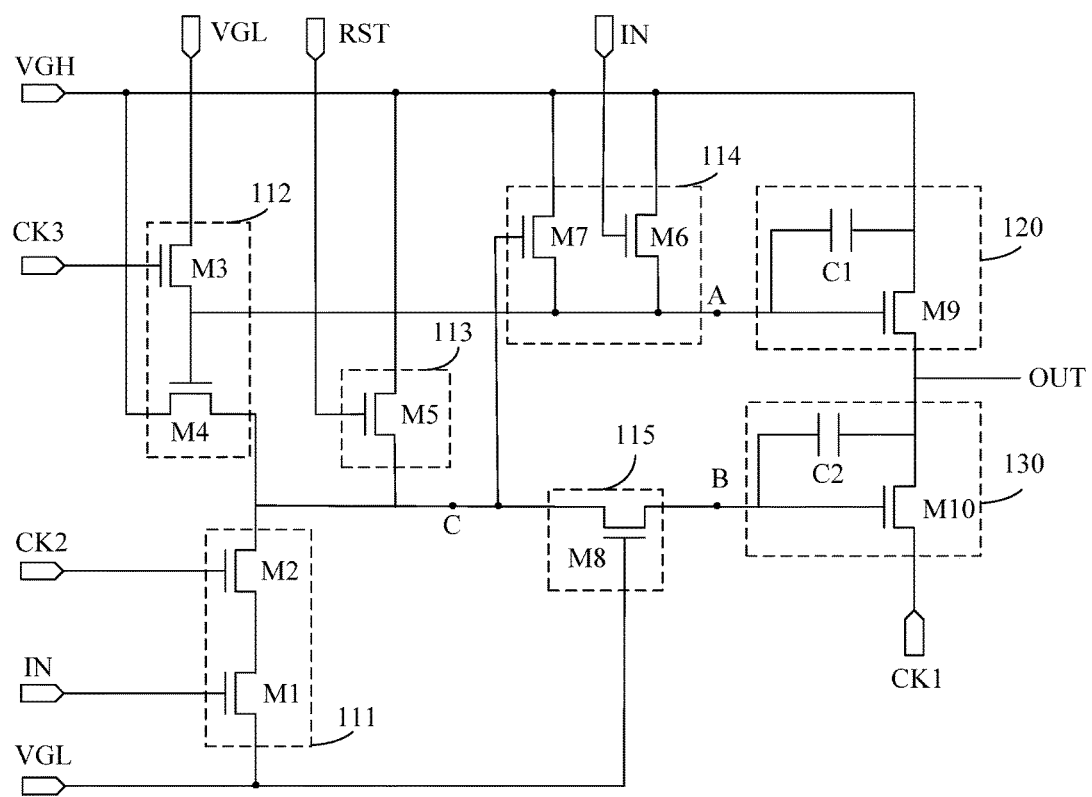
FIG. 3 is yet another schematic view showing the shift register unit according to one embodiment of the present disclosure.

As shown in FIG. 3, the first control sub-module 111 may include a first transistor M1 and a second transistor M2. A first electrode of the first transistor M1 is connected to the second signal end VGL, a second electrode thereof is connected to a first electrode of the second transistor M2, and a third electrode thereof is connected to the input signal end IN. The first electrode of the second transistor M2 is connected to the second electrode of the first transistor M1, a second electrode thereof is connected to the third node C, and a third electrode thereof is connected to the second clock signal end CK2.

Alternatively, as shown in FIG. 3, the second control sub-module 112 may include a third transistor M3 and a fourth transistor M4. A first electrode of the third transistor M3 is connected to the second signal end VGL, a second electrode thereof is connected to the first node A and a third electrode of the fourth transistor M4, and a third electrode thereof is connected to the third clock signal end CK3. A first electrode of the fourth transistor M4 is connected to the first signal end VGH, a second electrode thereof is connected to the third node C, and the third electrode thereof is connected to the second electrode of the third transistor M3.

Alternatively, as shown in FIG. 3, the resetting sub-module 113 may include a fifth transistor M5, a first electrode of which is connected to the first signal end VGH, a second electrode of which is connected to the third node C, and a third electrode of which is connected to the resetting signal end RST.

Alternatively, as shown in FIG. 3, the pull-up sub-module 114 may include a sixth transistor M6 and a seventh transistor M7. A first electrode of the sixth transistor M6 is connected to the first signal end VGH, a second electrode thereof is connected to the first node A, and a third electrode thereof is connected to the input signal end IN. A first electrode of the seventh transistor M7 is connected to the first signal end VGH, a second electrode thereof is connected to the first node A, and a third electrode thereof is connected to the third node C.

Alternatively, as shown in FIG. 3, the bleeder sub-module 115 may include an eighth transistor M8, a first electrode of which is connected to the third node C, a second electrode of which is connected to the second node B, and a third electrode of which is connected to the second signal end VGL. The eighth transistor M8 may share the voltage applied to the second electrode of the second transistor M2 of the first control sub-module 111, so as to prevent an excessively large voltage difference between the first electrode and the second electrode of the second transistor M2, thereby to prevent the occurrence of electric leakage at the second transistor M2.

In some embodiments of the present disclosure, the first and second output modules may each merely consist of transistors and capacitors. To be specific, each of them may merely consist of one transistor and one capacitor, so as to facilitate the manufacture thereof, reduce the production cost and improve the efficiency.

Alternatively, as shown in FIG. 3, the first output module 120 may include a ninth transistor M9 and a first capacitor C1. A first electrode of the ninth transistor M9 is connected to the first signal end VGH, a second electrode thereof is connected to the output end OUT, and a third electrode thereof is connected to the first node A. A first electrode of the first capacitor C1 is connected to the first electrode of the ninth transistor M9, and a second electrode thereof is connected to the third electrode of the ninth transistor M9.

Further, as shown in FIG. 3, the second output module 130 may include a tenth transistor M10 and a second capacitor C2. A first electrode of the tenth transistor M10 is connected to the first clock signal end CK1, a second electrode thereof is connected to the output end OUT, and a third electrode thereof is connected to the second node B. A first electrode of the second capacitor C2 is connected to the second electrode of the tenth transistor M10 and a second electrode thereof is connected to the third electrode of the tenth transistor M10.

The shift register unit in the embodiments of the present disclosure includes ten transistors and two capacitors so as to control the potentials at the output end. As a result, it is able to simplify the structure of the shift register unit and reduce a layout area of the shift register unit, thereby to facilitate the manufacture of a high-resolution display device.

According to the embodiments of the present disclosure, the shift register unit includes the control module, the first output module and the second output module, so as to control the potentials at the output end. As a result, it is able to simplify a circuit structure of the shift register unit and a control procedure thereof, thereby to output a stable voltage by the output end.

Figure 4:
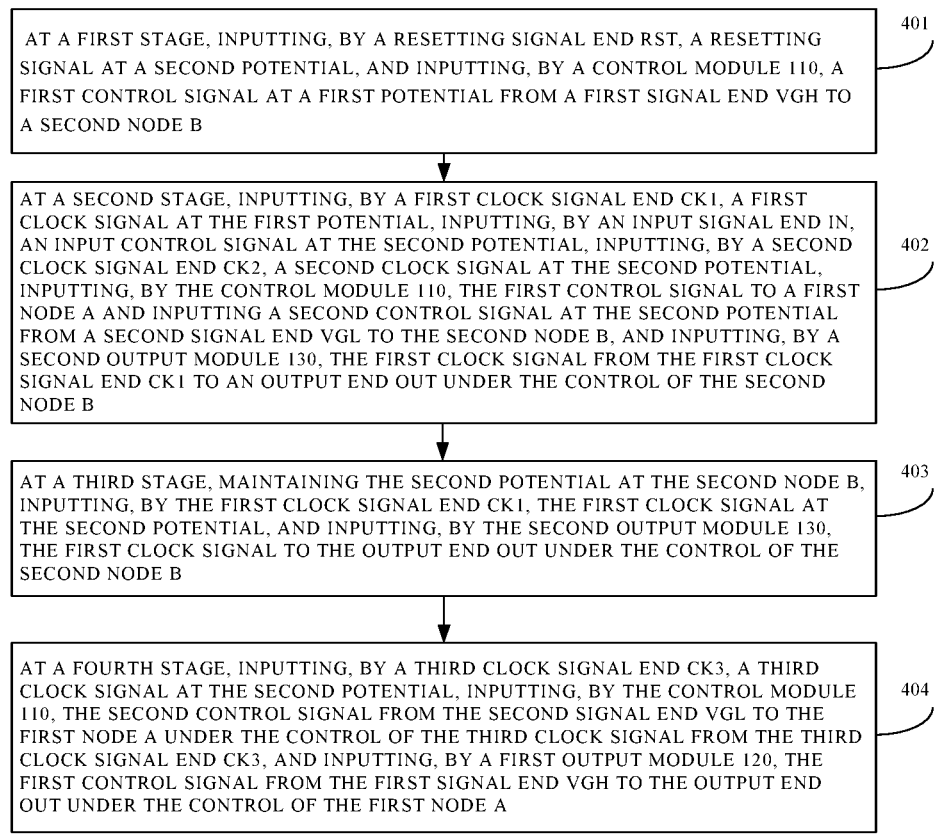
FIG. 4 is a flow chart of a method for driving the shift register unit according to one embodiment of the present disclosure.

FIG. 4 is a flow chart of a method for driving the shift register unit which, as shown in FIG. 1, may include the control module 110, the first output module 120 and the second output module 130. The method includes the following steps.

Step 401: at a first stage, inputting, by the resetting signal end RST, the resetting signal at a second potential, and inputting, by the control module 110, the first control signal at a first potential from the first signal end VGH to the second node B.

Step 402: at a second stage, inputting, by the first clock signal end CK1, the first clock signal at the first potential, inputting, by the input signal end IN, the input control signal at the second potential, inputting, by the second clock signal end CK2, the second clock signal at the second potential, inputting, by the control module 110, the first control signal to the first node A and inputting the second control signal at the second potential from the second signal end VGL to the second node B, and inputting, by the second output module 130, the first clock signal from the first clock signal end CK1 to the output end OUT under the control of the second node B.

Step 403: at a third stage, maintaining the second potential at the second node B, inputting, by the first clock signal end CK1, the first clock signal at the second potential, and inputting, by the second output module 130, the first clock signal to the output end OUT under the control of the second node B.

Step 404: at a fourth stage, inputting, by the third clock signal end CK3, the third clock signal at the second potential, inputting, by the control module 110, the second control signal from the second signal end VGL to the first node A under the control of the third clock signal from the third clock signal end CK3, and inputting, by the first output module 120, the first control signal from the first signal end VGH to the output end OUT under the control of the first node A.

According to the method for driving the shift register unit in the embodiments of the present disclosure, through the control module, the first output module and the second output module in the shift register unit, it is able to control the potentials at the output end. As a result, it is able to simplify a circuit structure of the shift register unit and a control procedure thereof, thereby to output a stable voltage by the output end.

Alternatively, as shown in FIG. 2, the control module 110 includes the first control sub-module 111, the second control sub-module 112, the resetting sub-module 113, the pull-up sub-module 114 and the bleeder sub-module 115. At this time, Step 402 may include: at the second stage, inputting, by the second clock signal end CK2, the second clock signal at the second potential, inputting, by the input signal end IN, the input control signal at the second potential, and inputting, by the first control sub-module 111, the second control signal from the second signal end VGL to the third node C. Step 404 may include, at the fourth stage, inputting, by the third clock signal end CK3, the third clock signal at the second potential, inputting, by the second control sub-module 112, the second control signal from the second signal end VGL to the first node A and inputting the first control signal from the first signal end VGH to the third node C. Step 401 may include, at the first stage, inputting, by the resetting signal end RST, the resetting signal at the second potential, and inputting, by the resetting sub-module 113, the first control signal to the second node B. Step 402 may include, at the second stage, inputting, by the input signal end IN, the input control signal at the second potential, maintaining the second potential at the third node C, and inputting, by the pull-up sub-module 114, the first control signal from the first signal end VGH to the first node A. The method further includes, at the first to fourth stages, inputting, by the second signal end VGL, the second control signal at the second potential, and inputting, by the bleeder sub-module 115, the potential at the third node C to the second node B.

Alternatively, as shown in FIG. 3, the first control sub-module 111 includes the first transistor M1 and the second transistor M2. At this time, Step 402 may include, at the second stage, inputting, by the second clock signal end CK2, the second clock signal at the second potential, inputting, by the input signal end IN, the input control signal at the second potential to turn on the first transistor M1 and the second transistor M2, and inputting, by the second signal end VGL, the second control signal to the third node C.

Alternatively, the second control sub-module 112 may include the third transistor M3 and the fourth transistor M4. At this time, Step 404 may include, at the fourth stage, inputting, by the third clock signal end CK3, the third clock signal at the second potential to turn on the third transistor M3, inputting, by the second signal end VGL, the second control signal at the second potential to the first node A and a third electrode of the fourth transistor M4 so as to turn on the fourth transistor M4, and inputting, by the first signal end VGH, the first control signal to the third node C.

Alternatively, the resetting sub-module 113 may include the fifth transistor M5. At this time, Step 401 may include, at the first stage, inputting, by the resetting signal end RST, the resetting signal at the second potential to turn on the fifth transistor M5, and inputting, by the first signal end VGH, the first control signal to the third node C. At this time, the tenth transistor M10 is turned off, so no signal is outputted by the output end OUT.

Alternatively, the pull-up sub-module 114 may include the sixth transistor M6 and the seventh transistor M7. At this time, Step 402 may include, at the second stage, inputting, by the input signal end IN, the input control signal at the second potential. At the second stage, the second clock signal from the second clock signal end CK2 is also at the second potential, so the first control sub-module 111 may input the second control signal from the second signal end VGL to the third node C, and at this time, the node C is at the second potential, so as to turn on the sixth transistor M6 and the seventh transistor M7. The first signal end VGH inputs the first control signal at the first potential to the first node A, at this time, the first capacitor C1 stores the first potential. Because the pull-up sub-module 114 includes the sixth transistor M6 and the seventh transistor M7, at the second stage, the two transistors may input the first control signal from the first signal end to the first node A, so as to maintain the first node A at the first potential, thereby to turn off the ninth transistor M9 of the first output module 120. In this way, it is able for the output end OUT to output the first clock signal from the first clock signal end CK1, i.e., to output a stable voltage.

Alternatively, as shown in FIG. 3, the bleeder sub-module 115 may include the eighth transistor M8. The method may further include, at the first to fourth stages, inputting, by the second signal end VGL, the second control signal at the second potential so as to turn on the eighth transistor M8, and inputting, by the third node C, the potential at the third node C to the second node B. In some embodiments of the present disclosure, the eighth transistor M8 is mainly used for sharing the voltages applied to the second electrode of the second transistor M2 of the first control sub-module 111, so as to present the occurrence of electric leakage at the second transistor M2.

Alternatively, as shown in FIG. 3, the first output module 120 may include the ninth transistor M9 and the first capacitor C1. At this time, Step 404 may include, at the fourth stage, inputting, by the control module 110, the second control signal at the second potential from the second signal end VGL to the first node A so as to turn on the ninth transistor M9, and inputting, by the ninth transistor M9, the first control signal from the first signal end VGH to the output end OUT. Step 402 may include, at the second stage, inputting, by the control module 110, the first control signal from the first signal end VGH to the first node A so as to turn off the ninth transistor M9.

Alternatively, as shown in FIG. 3, the second output module 130 may include the tenth transistor M10 and the second capacitor C2. Step 401 may include, at the first stage, inputting, by the control module 110, the first control signal at the first potential to the second node B so as to turn off the tenth transistor M10. At this time, no signal is outputted by the output end OUT, and the shift register unit is within a resetting state. Step 402 may include, at the second stage, inputting, by the control module 110, the second control signal at the second potential from the second signal end VGL to the second node B so as to turn on the tenth transistor M10. The second capacitor C2 stores the second potential of the second control signal, and the tenth transistor M10 inputs the first clock signal from the first clock signal end CK1 to the output end OUT. Step 403 may include, at the third stage, maintaining the second potential at the second node B (because the second capacitor C2 stores the second potential of the second control signal at the second stage) so as to turn on the tenth transistor M10, and inputting, by the tenth transistor M10, the first clock signal from the first clock signal end CK1 to the output end OUT. In addition, because the first capacitor C1 stores the first potential of the first control signal at the second stage, the first node A may be maintained at the first potential at the third stage. At this time, the ninth transistor M9 of the first output module 120 is turned off, so as to enable the output end OUT to stably output the first clock signal from the first clock signal end CK1.

Figure 5:
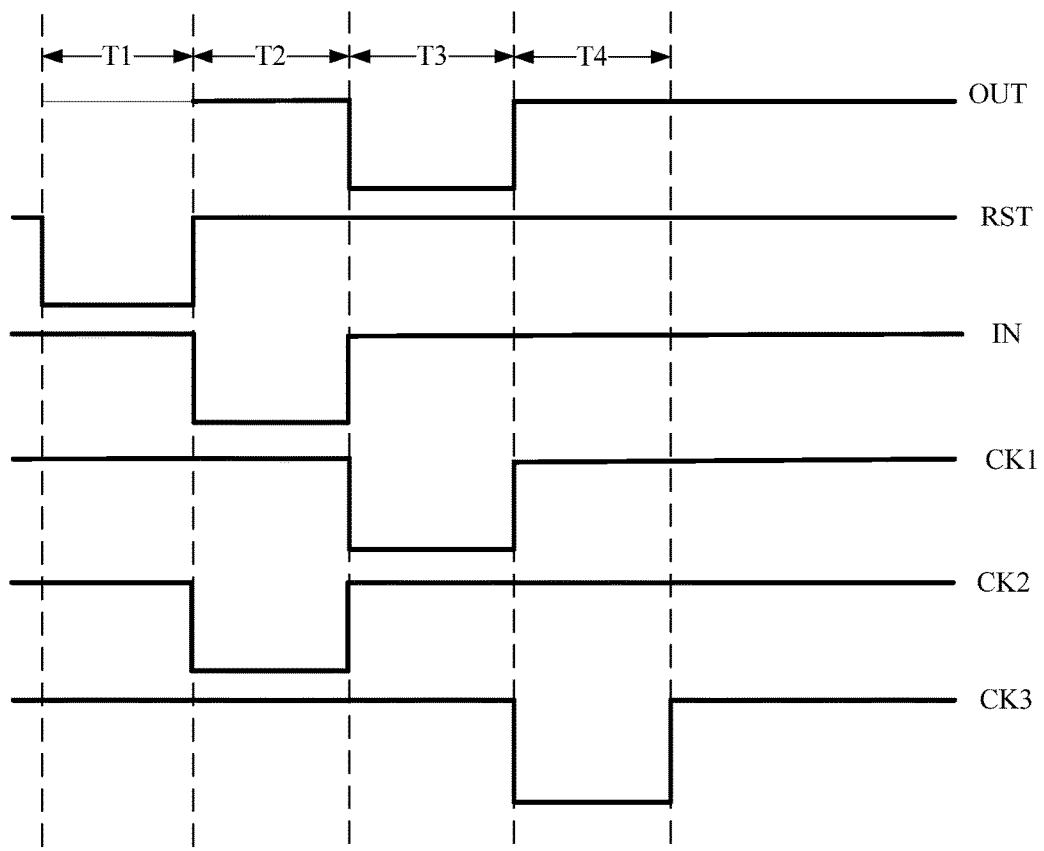
FIG. 5 is schematic view showing the potential changes at a first clock signal end, a second clock signal end, a third clock signal end, a signal input end, a resetting signal end and an output end according to one embodiment of the present disclosure.

FIG. 5 shows the potential changes for the first clock signal end CK1, the second clock signal end CK2, the third clock signal end CK3, the input signal end IN, the resetting signal end RST and the output end OUT at the first stage T1, the second stage T2, the third stage T3 and the fourth stage T4.

It should be appreciated that, in the above-mentioned embodiments, the transistors M1 to M10 are all P-type transistors, the first potential is a high potential, and the second potential is a low potential. Of course, these transistors M1 to M10 may also be N-type transistors, and at this time, the first potential is a low potential, the second potential is a high potential, and the potential changes for the first clock signal end CK1, the second clock signal end CK2, the third clock signal end CK3, the input signal end IN and the resetting signal end RST may be reverse to that shown in FIG. 5 (i.e., with a phase difference of 180°).

According to the method for driving the shift register unit in the embodiments of the present disclosure, through the control module, the first output module and the second output module in the shift register unit, it is able to control the potentials at the output end. As a result, it is able to simplify a circuit structure of the shift register unit and a control procedure thereof, thereby to output a stable voltage by the output end.

The present disclosure further provides in some embodiments a gate driver circuit including at least two of the shift register units in FIG. 1, 2 or 3 connected to each other in a cascaded manner.

The present disclosure further provides in some embodiments a display device including the above-mentioned gate driver circuit. The display device may be any product or member having a display function, such as a liquid crystal panel, an electronic paper, an organic light-emitting diode panel, an active matrix organic light-emitting diode panel, a mobile phone, a flat-panel computer, a television, a display, a laptop computer, a digital photo frame or a navigator.

The above are merely the preferred embodiments of the present disclosure, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A shift register unit, comprising a control circuit, a first output circuit and a second output circuit,
    wherein the first output circuit is directly connected to a first signal end, a first node, and an output end, and configured to input a first control signal from the first signal end to the output end under a control of the first node so that the output end outputs the first control signal;
    the second output circuit is directly connected to the output end, a second node, and a first clock signal end, and configured to input a first clock signal from the first clock signal end to the output end under a control of the second node; and
    the control circuit is directly connected to the first node, the second node, the first signal end, a second signal end, a second clock signal end, a third clock signal end, an input signal end, and a resetting signal end, and configured to control potentials at the first node and the second node under a control of the first control signal from the first signal end, a second control signal from the second signal end, a second clock signal from the second clock signal end, a third clock signal from the third clock signal end, an input control signal from the input signal end, and a resetting signal from the resetting signal end,
    wherein the control circuit comprises a second control sub-circuit, and the second control sub-circuit is directly connected to the third clock signal end, the first signal end, the second signal end, the first node, and a third node, and configured to input the second control signal from the second signal end to the first node and input the first control signal from the first signal end to the third node under a control of the third clock signal from the third clock signal end.

2. The shift register unit according to claim 1, wherein the control circuit further comprises a first control sub-circuit, a resetting sub-circuit, a pull-up sub-circuit and a bleeder sub-circuit;
    the first control sub-circuit is connected to the input signal end, the second clock signal end, the second signal end and the third node, and configured to input the second control signal from the second signal end to the third node under a control of the input control signal from the input signal end and the second clock signal from the second clock signal end;

the resetting sub-circuit is connected to the resetting signal end, the first signal end and the third node, and configured to input the first control signal from the first signal end to the third node under a control of the resetting signal from the resetting signal end;

the pull-up sub-circuit is connected to the third node, the first signal end, the input signal end and the first node, and configured to input the first control signal from the first signal end to the first node under a control of the input control signal from the input signal end and the third node; and the bleeder sub-circuit is connected to the second signal end, the third node and the second node, and configured to input a potential at the third node to the second node under a control of the second control signal from the second signal end.

3. The shift register unit according to claim 2, wherein the first control sub-circuit comprises a first transistor and a second transistor;

a first electrode of the first transistor is connected to the second signal end, a second electrode of the first transistor is connected to a first electrode of the second transistor, and a third electrode of the first transistor is connected to the input signal end; and the first electrode of the second transistor is connected to the second electrode of the first transistor, a second electrode of the second transistor is connected to the third node, and a third electrode of the second transistor is connected to the second clock signal end.

4. The shift register unit according to claim 2, wherein the second control sub-circuit comprises a third transistor and a fourth transistor;

a first electrode of the third transistor is connected to the second signal end, a second electrode of the third transistor is connected to the first node and a third electrode of the fourth transistor, and a third electrode of the third transistor is connected to the third clock signal end; and a first electrode of the fourth transistor is connected to the first signal end, a second electrode of the fourth transistor is connected to the third node, and the third electrode of the fourth transistor is connected to the second electrode of the third transistor.

5. The shift register unit according to claim 2, wherein the resetting sub-circuit comprises a fifth transistor, a first electrode of which is connected to the first signal end, a second electrode of which is connected to the third node, and a third electrode of which is connected to the resetting signal end.

6. The shift register unit according to claim 2, wherein the pull-up sub-circuit comprises a sixth transistor and a seventh transistor;

a first electrode of the sixth transistor is connected to the first signal end, a second electrode of the sixth transistor is connected to the first node, and a third electrode of the sixth transistor is connected to the input signal end; and a first electrode of the seventh transistor is connected to the first signal end, a second electrode of the seventh transistor is connected to the first node, and a third electrode of the seventh transistor is connected to the third node.

7. The shift register unit according to claim 2, wherein the bleeder sub-circuit comprises an eighth transistor, a first electrode of which is connected to the third node, a second electrode of which is connected to the second node, and a third electrode of which is connected to the second signal end.

8. The shift register unit according to claim 1, wherein the first output circuit comprises a ninth transistor and a first capacitor;

a first electrode of the ninth transistor is connected to the first signal end, a second electrode of the ninth transistor is connected to the output end, and a third electrode of the ninth transistor is connected to the first node; and a first electrode of the first capacitor is connected to the first electrode of the ninth transistor, and a second electrode of the first capacitor is connected to the third electrode of the ninth transistor.

9. The shift register unit according to claim 1, wherein the second output circuit comprises a tenth transistor and a second capacitor;

a first electrode of the tenth transistor is connected to the first clock signal end, a second electrode of the tenth transistor is connected to the output end, and a third electrode of the tenth transistor is connected to the second node; and a first electrode of the second capacitor is connected to the second electrode of the tenth transistor and a second electrode of the second capacitor is connected to the third electrode of the tenth transistor.

10. A method for driving the shift register unit according to claim 1, comprising:

at a first stage, inputting, by a resetting signal end, a resetting signal at a second potential, and inputting, by the control circuit, a first control signal at a first potential from a first signal end to a second node;

at a second stage, inputting, by a first clock signal end, a first clock signal at the first potential, inputting, by an input signal end, an input control signal at the second potential, inputting, by a second clock signal end, a second clock signal at the second potential, inputting, by the control circuit, the first control signal to a first node and inputting a second control signal at the second potential from a second signal end to the second node, and inputting, by the second output circuit, the first clock signal from the first clock signal end to an output end under a control of the second node;

at a third stage, maintaining the second potential at the second node, inputting, by the first clock signal end, the first clock signal at the second potential, and inputting, by the second output circuit, the first clock signal to the output end under a control of the second node; and at a fourth stage, inputting, by a third clock signal end, a third clock signal at the second potential, inputting, by the control circuit, the second control signal from the second signal end to the first node under a control of the third clock signal from the third clock signal end, and inputting, by the first output circuit, the first control signal from the first signal end to the output end under a control of the first node so that the output end outputs the first control signal.

11. The method according to claim 10, wherein the control circuit further comprises a first control sub-circuit, a second control sub-circuit, a resetting sub-circuit, a pull-up sub-circuit and a bleeder sub-circuit, and the method further comprises:

at the second stage, inputting, by the second clock signal end, the second clock signal at the second potential, inputting, by the input signal end, the input control signal at the second potential, and inputting, by the first control sub-circuit, the second control signal from the second signal end to the third node;

at the fourth stage, inputting, by the third clock signal end, the third clock signal at the second potential, inputting, by the second control sub-circuit, the second control signal from the second signal end to the first node and inputting the first control signal from the first signal end to the third node;

at the first stage, inputting, by the resetting signal end, the resetting signal at the second potential, and inputting, by the resetting sub-circuit, the first control signal to the second node;

at the second stage, inputting, by the input signal end, the input control signal at the second potential, maintaining the second potential at the third node, and inputting, by the pull-up sub-circuit, the first control signal from the first signal end to the first node; and at the first to fourth stages, inputting, by the second signal end, the second control signal at the second potential, and inputting, by the bleeder sub-circuit, a potential at the third node to the second node.

12. The method according to claim 11, wherein the first control sub-circuit comprises a first transistor and a second transistor, and the method further comprises:

at the second stage, inputting, by the second clock signal end, the second clock signal at the second potential, inputting, by the input signal end, the input control signal at the second potential to turn on the first transistor and the second transistor, and inputting, by the second signal end, the second control signal to the third node.

13. The method according to claim 11, wherein the second control sub-circuit comprises a third transistor and a fourth transistor, and the method further comprises:

at the fourth stage, inputting, by the third clock signal end, the third clock signal at the second potential to turn on the third transistor, inputting, by the second signal end, the second control signal at the second potential to the first node and a third electrode of the fourth transistor to turn on the fourth transistor, and inputting, by the first signal end, the first control signal to the third node.

14. The method according to claim 11, wherein the resetting sub-circuit comprises a fifth transistor, and the method further comprises:

at the first stage, inputting, by the resetting signal end, the resetting signal at the second potential to turn on the fifth transistor, and inputting, by the first signal end, the first control signal to the third node.

15. The method according to claim 11, wherein the pull-up sub-circuit comprises a sixth transistor and a seventh transistor, and the method further comprises:

at the second stage, inputting, by the input signal end, the input control signal at the second potential, maintaining the second potential at the third node to turn on the sixth transistor and the seventh transistor, and inputting, by the first signal end, the first control signal to the first node.

16. The method according to claim 11, wherein the bleeder sub-circuit comprises an eighth transistor, and the method further comprises:

at the first to fourth stages, inputting, by the second signal end, the second control signal at the second potential to turn on the eighth transistor, and inputting, by the third node, a potential at the third node to the second node.

17. The method according to claim 10, wherein the first output circuit comprises a ninth transistor and a first capacitor, and the method further comprises:

at the fourth stage, inputting, by the control circuit, the second control signal at the second potential from the second signal end to the first node to turn on the ninth transistor, and inputting, by the ninth transistor, the first control signal from the first signal end to the output end; and at the second stage, inputting, by the control circuit, the first control signal at the first potential from the first signal end to the first node to turn off the ninth transistor.

18. The method according to claim 10, wherein the second output circuit comprises a tenth transistor and a second capacitor, and the method further comprises:

at the first stage, inputting, by the control circuit, the first control signal at the first potential to the second node to turn off the tenth transistor;

at the second stage, inputting, by the control circuit, the second control signal at the second potential from the second signal end to the second node to turn on the tenth transistor, and inputting, by the tenth transistor, the first clock signal from the first clock signal end to the output end; and at the third stage, maintaining the second potential at the second node to turn on the tenth transistor, and inputting, by the tenth transistor, the first clock signal from the first clock signal end to the output end.

19. A gate driver circuit, comprising at least two of the shift register units according to claim 1 connected to each other in a cascaded manner.

20. A shift register unit, comprising:

a first transistor, a second transistor, a third transistor, a fourth transistor, a fifth transistor, a sixth transistor, a seventh transistor, an eighth transistor, a ninth transistor, a tenth transistor, a first capacitor, and a second capacitor, wherein a first electrode of the first transistor is connected to a second signal end, a second electrode of the first transistor is connected to a first electrode of the second transistor, and a third electrode of the first transistor is connected to an input signal end, and the first electrode of the second transistor is connected to the second electrode of the first transistor, a second electrode of the second transistor is connected to a third node, and a third electrode of the second transistor is connected to a second clock signal end;

a first electrode of the third transistor is connected to the second signal end, a second electrode of the third transistor is connected to a first node and a third electrode of the fourth transistor, and a third electrode of the third transistor is connected to a third clock signal end, and a first electrode of the fourth transistor is connected to a first signal end, a second electrode of the fourth transistor is connected to the third node, and the third electrode of the fourth transistor is connected to the second electrode of the third transistor;

a first electrode of the fifth transistor is connected to the first signal end, a second electrode of the fifth transistor is connected to the third node, and a third electrode of which is connected to a resetting signal end;

a first electrode of the sixth transistor is connected to the first signal end, a second electrode of the sixth transistor is connected to the first node, and a third electrode of the sixth transistor is connected to the input signal end, and a first electrode of the seventh transistor is connected to the first signal end, a second electrode of the seventh transistor is connected to the first node, and a third electrode of the seventh transistor is connected to the third node;

a first electrode of the eighth transistor is connected to the third node, a second electrode of the eighth transistor is connected to a second node, and a third electrode of the eighth transistor is connected to the second signal end;

a first electrode of the ninth transistor is connected to the first signal end, a second electrode of the ninth transistor is connected to an output end, and a third electrode of the ninth transistor is connected to the first node, and a first electrode of the first capacitor is connected to the first electrode of the ninth transistor, and a second electrode of the first capacitor is connected to the third electrode of the ninth transistor; and a first electrode of the tenth transistor is connected to a first clock signal end, a second electrode of the tenth transistor is connected to the output end, and a third electrode of the tenth transistor is connected to the second node, and a first electrode of the second capacitor is connected to the second electrode of the tenth transistor and a second electrode of the second capacitor is connected to the third electrode of the tenth transistor.

* * * * *